United States Patent
Yang et al.

(10) Patent No.: US 11,764,426 B2
(45) Date of Patent: Sep. 19, 2023

(54) ADAPTIVE FAN SPEED CONTROL FOR THERMAL MANAGEMENT OF A BATTERY

(71) Applicant: Baidu USA LLC, Sunnyvale, CA (US)

(72) Inventors: Huawei Yang, San Jose, CA (US); Shuai Shao, Milpitas, CA (US); Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 265 days.

(21) Appl. No.: 17/010,650

(22) Filed: Sep. 2, 2020

(65) Prior Publication Data

US 2022/0069382 A1 Mar. 3, 2022

(51) Int. Cl.
*H01M 10/6563* (2014.01)
*H01M 10/613* (2014.01)
*H01M 10/635* (2014.01)

(52) U.S. Cl.
CPC ..... *H01M 10/6563* (2015.04); *H01M 10/613* (2015.04); *H01M 10/635* (2015.04)

(58) Field of Classification Search
CPC ........... H01M 10/6563; H01M 10/613; H01M 10/635; H01M 2220/10; H01M 10/48; H01M 10/486; H01M 10/633; H01M 50/204; H01M 50/251; Y02E 60/10; H05K 7/1492; H05K 7/20209; H02J 7/007194; H02J 7/00309
See application file for complete search history.

(56) References Cited

U.S. PATENT DOCUMENTS

| | | | | |
|---|---|---|---|---|
| 2015/0380781 A1* | 12/2015 | Steinmeyer | ......... | H01M 10/486 429/50 |
| 2017/0047784 A1* | 2/2017 | Jung | ......................... | G06F 1/26 |

FOREIGN PATENT DOCUMENTS

| | | | | | |
|---|---|---|---|---|---|
| CN | 106042946 | A | * | 10/2016 | ............ H01M 10/48 |
| CN | 109564454 | A | * | 4/2019 | ............. G05B 15/02 |
| CN | 109921149 | A | * | 6/2019 | ............. Y02E 60/10 |
| CN | 109921499 | A | * | 6/2019 | ............. Y02E 60/10 |
| JP | H10143257 | A | * | 5/1998 | ......... H05K 7/20209 |
| JP | H10341505 | A | * | 12/1998 | ............. Y02E 60/10 |
| JP | 2020051065 | A | * | 4/2020 | ............. Y02E 60/10 |

* cited by examiner

*Primary Examiner* — Kaity V Chandler
(74) *Attorney, Agent, or Firm* — WOMBLE BOND DICKINSON (US) LLP

(57) ABSTRACT

A method of controlling a fan speed for a battery unit includes determining power discharge and a current temperature of a battery unit and obtaining a relationship between fan speed for the battery unit and temperature of the battery unit based on the power discharge and the current temperature of the battery unit. The method further includes identifying a minimum fan speed based on the relationship between fan speed and temperature and a maximum operating temperature of the battery unit and controlling the fan by setting the speed of the fan to the minimum fan speed.

18 Claims, 6 Drawing Sheets

ADAPTIVE FAN SPEED CONTROL FOR THERMAL MANAGEMENT OF A BATTERY

FIELD OF THE DISCLOSURE

Embodiments of the present invention relate generally to battery energy storage. More particularly, embodiments of the invention relate to adaptive fan speed control for thermal management of a battery unit.

BACKGROUND

Battery energy storage is an important as an energy storage method in various applications, such as electric vehicles, consumer electronics, micro-grids, solar and wind power storage, and data center backup units. Battery energy storage provides essential energy to support the applications as either the only source of power or as a backup source of power when a main source is unavailable. Therefore, it is important to ensure the availability and functionality of battery energy storage.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
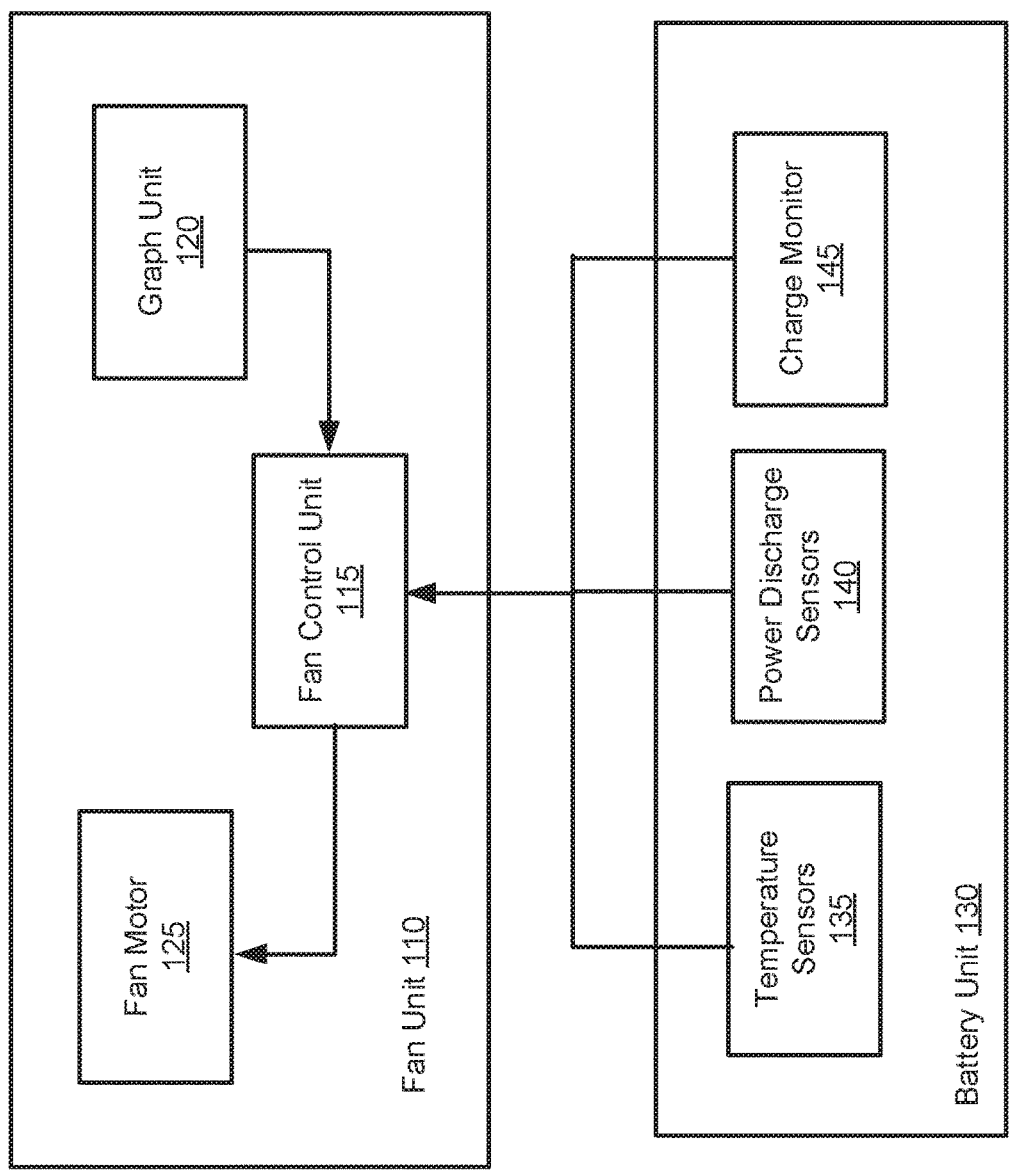
FIG. 1 is a block diagram illustrating an example of a system for controlling fan speed for thermal management of a battery according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Batteries may be used in various applications as either a backup power source or as the main source of power. As a battery discharges it may heat up. A battery may also have a maximum allowed operating temperature based on the specifications of the battery. Therefore, a fan may be used to cool the battery as it discharges. The fan may operate on power discharged from the battery. The higher the fan speed used to cool the battery, the more power is used from the battery. Therefore, fan speeds that are higher than necessary can reduce the discharge time of the battery.

Conventional systems increase battery discharge time by not using a fan to cool the battery. However, these systems are limited to small discharge times or low discharge power. Other conventional systems determine fan speed using only the discharge power of battery. However, such systems have limited adaptability and do not include a feedback loop to ensure operation of a fan at a minimum fan speed.

Embodiments of the present disclosure address the above deficiencies using adaptive fan speed control for a battery unit. During discharge of a battery unit, processing logic can adaptively control fan speed based on the discharging power of the battery. The adaptive control can identify a minimum fan speed that will keep the battery temperature below the critical cutoff. Therefore, the adaptive control can keep the temperature of the battery unit under the critical cutoff threshold while minimizing the energy costs for cooling. The minimized power usage of the fan may further increase the overall backup time that the battery unit can provide.

According to one aspect, a method of controlling a fan speed for a battery unit includes determining power discharge and a current temperature of a battery unit, obtaining a relationship between fan speed for the battery unit and temperature of the battery unit based on the power discharge and the current temperature of the battery unit, identifying a minimum fan speed based on the relationship between fan speed and temperature and a maximum operating temperature of the battery unit, and controlling the fan by setting the speed of the fan to the minimum fan speed.

In one embodiment, the method includes calculating an amount of energy remaining in the battery unit. In one embodiment, obtaining the relationship between the fan speed for the battery unit and temperature of the battery unit is further based on the amount of energy remaining in the battery. In one embodiment, obtaining the relationship between the fan speed and temperature of the battery unit includes obtaining a graph corresponding to the energy remaining in the battery, power discharge of the battery, and the current temperature of the battery. In one embodiment, the graph indicates an increase in temperature of the battery unit for a range of fan speeds after full discharge of the energy remaining in the battery unit.

In one embodiment, the method includes determining a remaining time of discharge for the battery unit and obtaining the relationship between the fan speed for the battery unit and temperature of the battery unit is based on the remaining time of discharge. In one embodiment, the method includes determining whether the current temperature is within a threshold range from the maximum allowed temperature of the battery unit, in response to determining that the current temperature is within the threshold range, identify a guaranteed fan speed based on a maximum power discharge of the battery, and controlling the fan by setting the fan speed to the guaranteed fan speed. In one embodiment, the battery unit is a battery backup unit of an electronic rack of a data center. In one embodiment, the power discharge and the current temperature are determined periodically to update the minimum fan speed.

According to another aspect, a battery backup unit includes instructions to control a fan speed including determining power discharge and a current temperature of a battery unit, obtaining a relationship between fan speed for the battery unit and temperature of the battery unit based on the power discharge and the current temperature of the battery unit, identifying a minimum fan speed based on the relationship between fan speed and temperature and a maximum operating temperature of the battery unit, and controlling the fan by setting the speed of the fan to the minimum fan speed.

FIG. 1 is a block diagram of an example system 100 for controlling fan speed for thermal management of a battery. The fan control unit 115 may include control logic to determine a minimum required fan speed and to control fan motor 125 to operate at the determined minimum required fan speed. For example, fan control unit 115 may retrieve measurements of the instantaneous discharge power of the battery and the temperature of the battery from power discharge sensors 140 and temperature sensors 135. The fan control unit 115 may retrieve the measurements at a periodic interval. Next, the fan control unit 115 may calculate the remaining energy stored in the battery. For example, the fan control unit 115 may calculate the total energy discharged from the battery and then subtract it from the original amount of energy stored at the battery to obtain the remaining energy, as shown below in equation (1). In another embodiment, charge monitor 145 may monitor and calculate the energy discharged from the battery unit 130. The charge monitor 145 may also track the health of the battery (e.g., number of charge/discharge cycles). Although depicted as included within the battery unit 130, charge monitor 145 may be physically separate from the battery and the battery unit 130.

$$E_{remain} = E_{origin} * SOH(\text{current cycle}) * SOC(t0) - E_{discharged} \quad (1)$$

In equation (1), $E_{remain}$ is the remaining energy stored in the battery, $E_{origin}$ is the amount of energy the battery would store if in full health (e.g., new battery), SOH(current cycle) is the state of health of the current battery as a percentage, and SOC(t0) is the state of charge of the battery. Therefore, the term $E_{origin} * SOH(\text{current cycle}) * SOC(t0)$ is the total energy stored in the battery prior to beginning of discharge. $E_{discharged}$ is the energy that has been discharged by the battery where $E_{discharged}$ can be calculated by equation (2) below $$E_{discharged} = \sum_{t0}^{t} P\_d \times ts \quad (2)$$

depicting the sum of the power discharged over the period of time from the beginning of discharge (t0) to the current time (t).

Once $E_{remain}$ has been calculated, the remaining energy ratio can be determined by equation (3) below $$\% E = \frac{E_{remain}}{E_{origin} * SOH(\text{current cycle})} \times 100\% \quad (3)$$

Additionally, the temperature rise allowance (i.e., the temperature the battery can rise until it hits a maximum temperature threshold) can be determined according to equation (4).

$$dT = T_{cutoff} - T_{cur} \quad (4)$$

where $T_{cutoff}$ is the maximum temperature threshold and $T_{cur}$ is the temperature measured at the current time by the temperature sensors 135.

In one embodiment, the fan control unit 115 may retrieve a graph from graph unit 120 corresponding to the determined remaining energy ratio, current temperature, and instantaneous discharge power. The graph may indicate the potential temperature rise for a range of fan speeds (RPMs). In one embodiment, the graph unit 120 may store a number of temperature rise v. RPM graphs corresponding to different combinations of remaining energy ratio, current temperature, and instantaneous discharge power. In one embodiment, the graphs are determined through experimentation of different values for the remaining energy ratio, current temperature, and instantaneous discharge power variables. In another embodiment, the graphs are determined by running simulations of the battery discharge with different values for the remaining energy ratio, temperature, and power discharge variables. In one embodiment, the graph may be selected based on the values associated with the graphs that most closely match the measured values of the variables.

Figure 2:
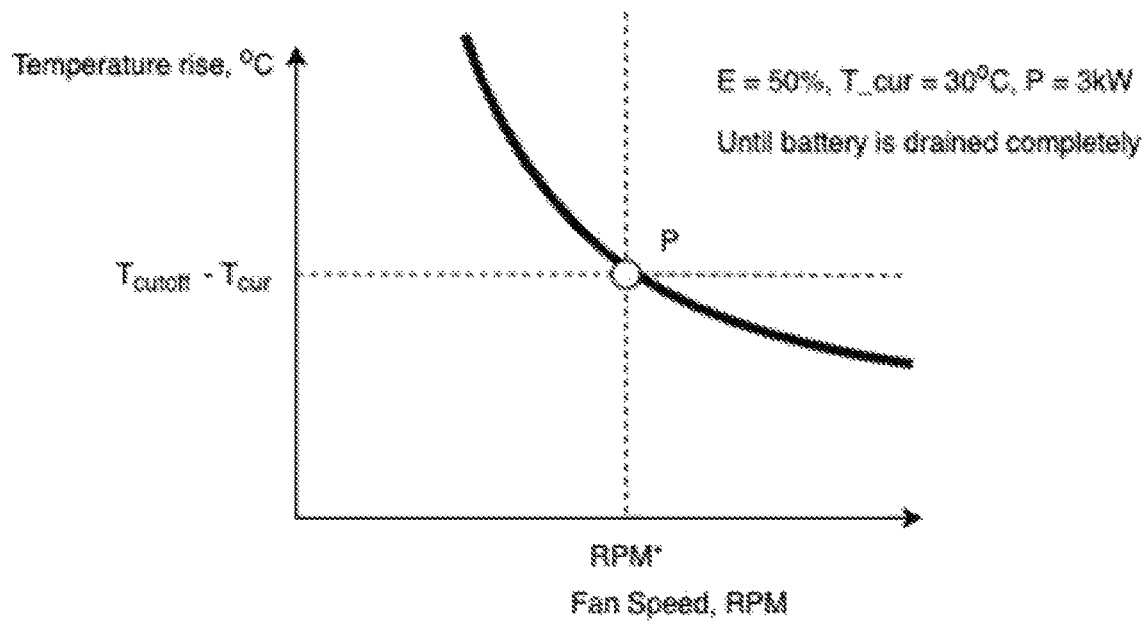
FIG. 2 is diagram illustrating an example correlation between fan speed and temperature rise of a battery according to one embodiment.

In one embodiment, once the corresponding graph is obtained from the graph unit 120, the fan control unit 115 may identify a minimum fan speed from the graph that is determined to keep the battery unit below the maximum temperature threshold after full discharge of the battery. For example, as depicted in FIG. 2, the graph may include a Y-axis for temperature rise (i.e., the amount the temperature will rise after full discharge of the power) and an X-axis for the fan speed. Therefore, the graph may indicate the temperature rise that will occur after full discharge of the battery for a range of fan speeds. As determined in equation (4), the allowed change in temperature may identify the point of the Y-axis that is the upper bound of allowed temperature rise. Therefore, the minimum fan speed can be identified as the fan speed that provides the largest temperature change that is smaller than or equal to the allowed change in temperature.

In one embodiment, the fan control unit 115 may find a graph from graph unit 120 corresponding to a time of discharge remaining, current temperature, and instantaneous power. The time of discharge remaining may indicate, for example, a time remaining until a backup generator is to be turned on for a data center. The graph may indicate the temperature rise for a range of fan speeds (RPMs). The graph unit 120 may store a number of graphs corresponding to different combinations of time of discharge remaining, current temperature, and instantaneous power. In one embodiment, the graphs are determined through experimentation of different values for the variables. In another embodiment, the graphs are determined by running simulations of the battery discharge with different values for the remaining discharge time, temperature, and power variables. In one embodiment, the graph may be selected based on the values associated with the graph that most closely match the measured values of the variables (i.e., time of discharge remaining, current temperature, and instantaneous power discharge).

Figure 3:
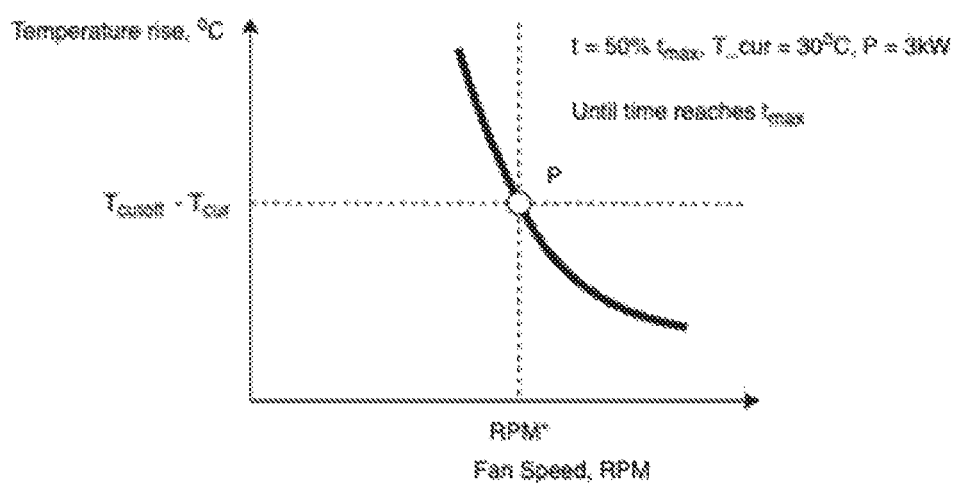
FIG. 3 is a diagram illustrating an example correlation between fan speed and temperature rise of a battery according to another embodiment.

In one embodiment, once the corresponding graph is obtained from the graph unit 120 the fan control unit 115 may identify a minimum fan speed that will keep the battery unit below the maximum temperature threshold after the time remaining for discharge is complete. For example, as depicted in FIG. 3, the graph may include a Y-axis for temperature rise (i.e., the amount the temperature will rise after full discharge of the power) and an X-axis for the fan speed. Therefore, the graph may indicate at each fan speed on the graph the temperature rise that will occur after discharge of the battery over the remaining discharge period for the most recently measured variables (i.e., time of discharge remaining, current temperature, and instantaneous power discharge). As determined in equation (4), the allowed change in temperature may identify the point of the Y-axis that is the upper bound of allowed temperature rise. Again, the minimum fan speed can be identified as the fan speed that provides the largest temperature change that is smaller than or equal to the allowed change in temperature.

In one example, near the end of discharge of the battery, if the current temperature of the battery is determined to be within a threshold difference of the maximum allowed temperature, the fan control unit 115 may determine to control the fan motor 125 to operate at a fan speed that guarantees the temperature of the battery will not exceed the maximum allowed temperature (guaranteed fan speed). For example, the fan control unit 115 may calculate the guaranteed fan speed by determining the fan speed that will keep the battery temperature below the maximum allowed temperature if completely discharged at maximum discharge power. Thus, if the current temperature approaches the maximum allowed temperature the fan control unit 115 can control the fan motor 125 at the guaranteed speed to ensure that the current temperature never reaches the maximum allowed temperature.

Figure 4:
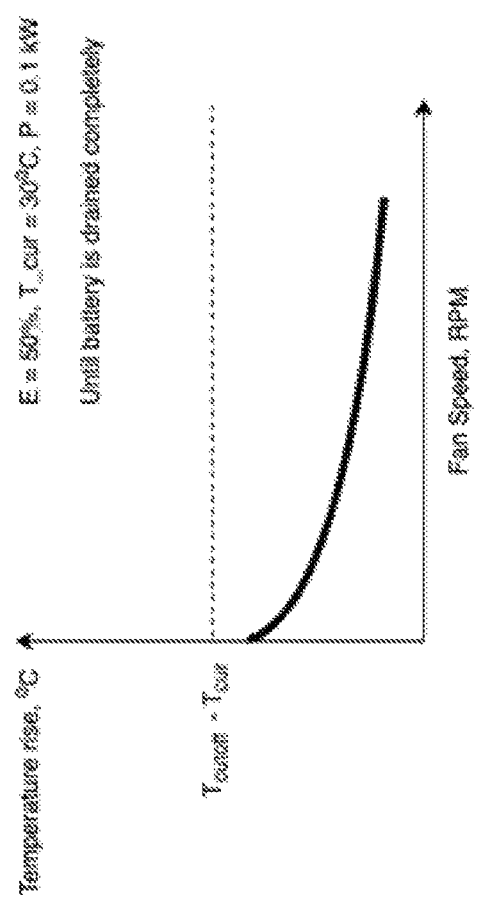
FIG. 4 is a diagram illustrating another example correlation between fan speed and temperature rise of a battery according to another embodiment.

In another embodiment, as depicted in FIG. 4, the current temperature of the battery may not reach the maximum allowed temperature even if fully discharged without the fan operating. For example, for a set of variables with a low power discharge and a low current temperature, the temperature of the battery may not increase significantly. Therefore, in such a case, the fan control unit 115 may determine not to turn on the fan under those conditions.

Figure 5:
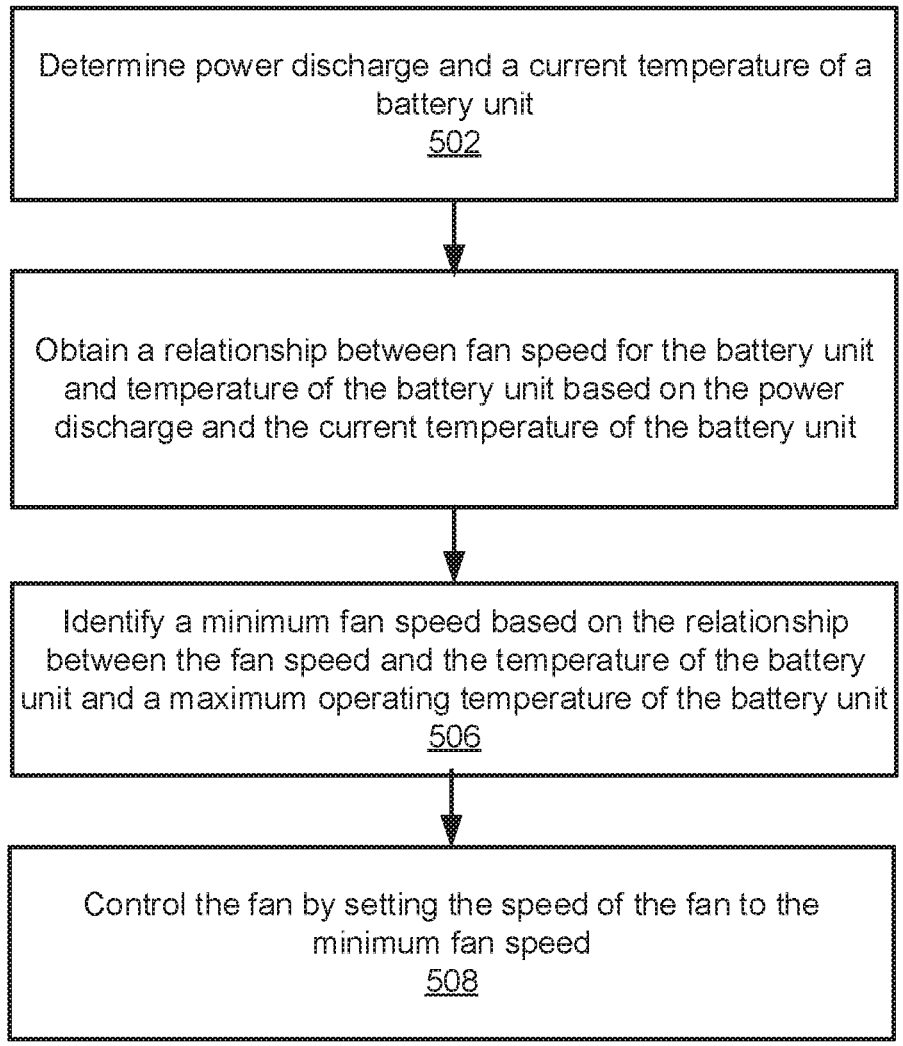
FIG. 5 is a flow diagram illustrating a process of determining a minimum fan speed for thermal management of a battery unit according to one embodiment.

FIG. 5 is a flow diagram illustrating an example of a process for determining a minimum fan speed for a battery unit according to one embodiment. Process 500 may be performed by processing logic which may include software, hardware, or a combination thereof. For example, process 500 may be performed by fan control unit 115 of FIG. 1.

Referring to FIG. 5, at block 502, processing logic determines power discharge and a current temperature of a battery unit. The power discharge may be the instantaneous power discharged from the battery at a particular point in time. For example, the power discharge may be measured by a power discharge sensor at periodic intervals. The periodic intervals may be any time interval (e.g., tenths of a second, seconds, minutes, etc.). In one embodiment, the current temperature of the battery may be measured by a temperature sensor at the battery unit. For example, the temperature sensor may be located on the surface of a battery of the battery unit and may measure the skin temperature (i.e., surface temperature) of the battery. The processing logic may receive the current temperature of the battery unit from the temperature sensors at a periodic interval (e.g., seconds, minutes, or any other interval). In one embodiment, the processing logic may also calculate how much energy is remaining in the battery unit to be discharged based on the amount of energy that has already been discharged and the charge of the battery unit at the time discharge began. In another embodiment, the processing logic determines a time of discharge remaining based on a total time of discharge and the time elapsed since discharge began.

At block 504, the processing logic obtains a relationship between fan speed for the battery unit and temperature of the battery unit based on the power discharge and the current temperature of the battery unit. The fan speed may be measured in revolutions per minute (RPMs). The relationship may be represented by a graph plotting a temperature rise of the battery against RPMs of the fan. The temperature rise may be the rise in temperature that is calculated to occur after complete discharge of the battery, after a predetermined time of discharge is completed, or after any other specified condition is satisfied. Several graphs may be stored in a memory or storage associated with the processing logic. Each graph may indicate a particular relationship between temperature rise and fan speed for specific values of power discharge and the current temperature of the battery unit. In one embodiment, the graph is selected based on the power discharge and the current temperature of the battery unit determined at block 502. The graph may further be selected based on the energy remaining in the battery or the amount of time remaining for discharge.

At block 506, processing logic identifies a minimum fan speed based on the relationship between the fan speed and the temperature of the battery and a maximum operating temperature of the battery unit. The minimum fan speed may be a speed of the fan that minimizes fan speed and energy consumption of the fan while ensuring that the temperature of the battery does not exceed a maximum allowed temperature of the battery. For example, using the graph obtained at block 504, the processing logic may determine the point on the graph at which the temperature rise is nearest the allowed temperature rise and is less than or equal to the allowed temperature rise. At block 508, processing logic controls the fan by setting the speed of the fan to the minimum fan speed.

In some embodiments, the relationship and graph obtained at block 504 may indicate that at the current power discharge the temperature of the battery will not reach the maximum allowed temperature before the battery is fully discharged or the discharge time is completed even if the fan is not turned on. In such a case, the minimum fan speed may be determined to be zero.

Figure 6:
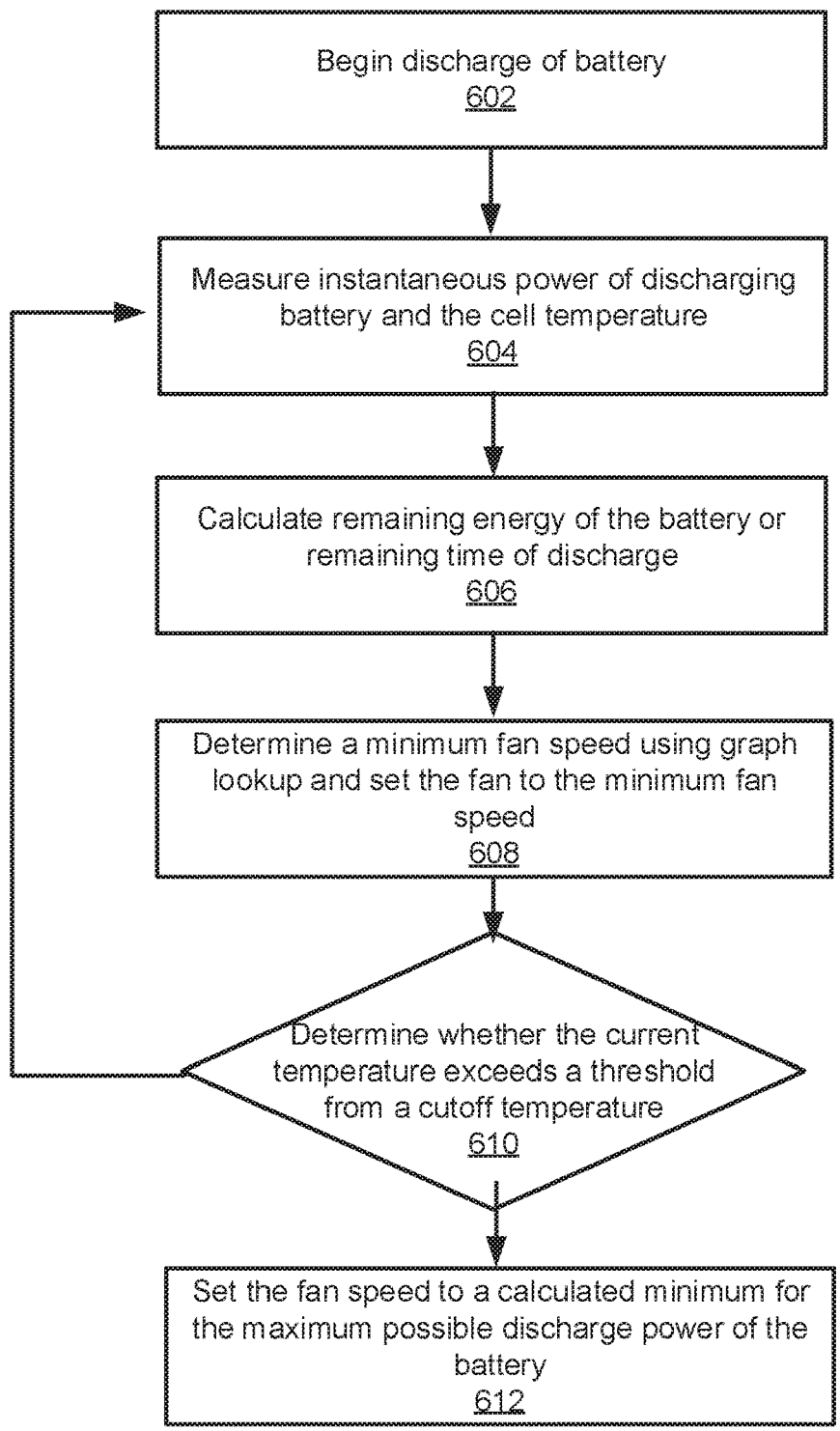
FIG. 6 is a flow diagram illustrating another process of determining fan speed for thermal management of a battery unit according to another embodiment.

FIG. 6 is a flow diagram illustrating an example of a process for determining an optimal pump speed of a liquid pump according to one embodiment. Process 600 may be performed by processing logic which may include software, hardware, or a combination thereof. For example, process 600 may be performed by fan control unit 115 of FIG. 1.

Referring to FIG. 6, at block 602, processing logic begins discharge of a battery. In one embodiment, the battery may be a battery backup unit and may be discharged upon a main power supply outage. In another embodiment, the battery may be a battery of an autonomous vehicle or other battery powered unit and may discharge upon being powered on. The processing logic may also identify a charge of the battery (i.e., energy stored in the battery) at the time discharge begins.

At block 604, processing logic measures instantaneous power of discharging battery and the cell temperature. The instantaneous power of the discharging battery and the cell temperature may be measured by sensors associated with the battery. For example, temperature sensors may be attached to the battery to measure a surface temperature of one or more cells of the battery. A discharge sensor may measure the power being discharged by the battery at any given time.

At block 606, processing logic calculates remaining energy of the battery or remaining time of discharge. The processing logic may use the discharge sensor to determine an amount of energy discharged by the battery since discharge of the battery began. The processing logic may determine the remaining energy by subtracting the amount of energy discharged from the charge of the battery at the time discharge began, as described above with respect to FIG. 1.

At block 608, processing logic determines a minimum fan speed using graph lookup and sets the fan to the minimum fan speed. The processing logic may search from several graphs that each correspond to a relationship between temperature of the battery and fan speed for a set of values for a number of variables. In one embodiment, the processing logic may search the graphs to identify a graph with the nearest values of the remaining energy of the battery, the current measured temperature of the battery, and the instantaneous power discharge of the battery. Once the graph with the most closely matched variables to the current state of the battery, the processing logic may use the graph to identify the minimum fan speed. For example, each graph may include a single point that indicates the minimum fan speed to be selected. That point may be a point on the graph that is nearest the maximum allowed temperature rise that is less than or equal to the maximum allowed temperature. Thus, the minimum fan speed can then be identified by the point on the graph.

At block 610, processing logic determines whether the current temperature is within a threshold difference from a cutoff temperature. The cutoff temperature may be the maximum allowed temperature of the battery. Thus, if within a threshold different from the cutoff temperature the fan speed should be set to a minimum guaranteed speed that ensures the temperature will not exceed the maximum allowed temperature even at maximum discharge. The processing logic may use the maximum discharging power of the battery to calculate the minimum guaranteed speed of the fan. If the processing logic determines that the current temperature is within the threshold difference, the process continues to block 612. At block 612, processing logic sets the fan speed to the minimum guaranteed speed calculated for the maximum possible discharge power of the battery until the battery is either fully discharged or the remaining time of discharge is complete. Otherwise, if the processing logic at block 610 determines that the current temperature is not within the threshold, the fan speed is set at the minimum fan speed determined at block 608 and returns to block 604. Blocks 604-610 may be repeated until discharge is complete or until the threshold at block 610 is reached.

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Figure 7:
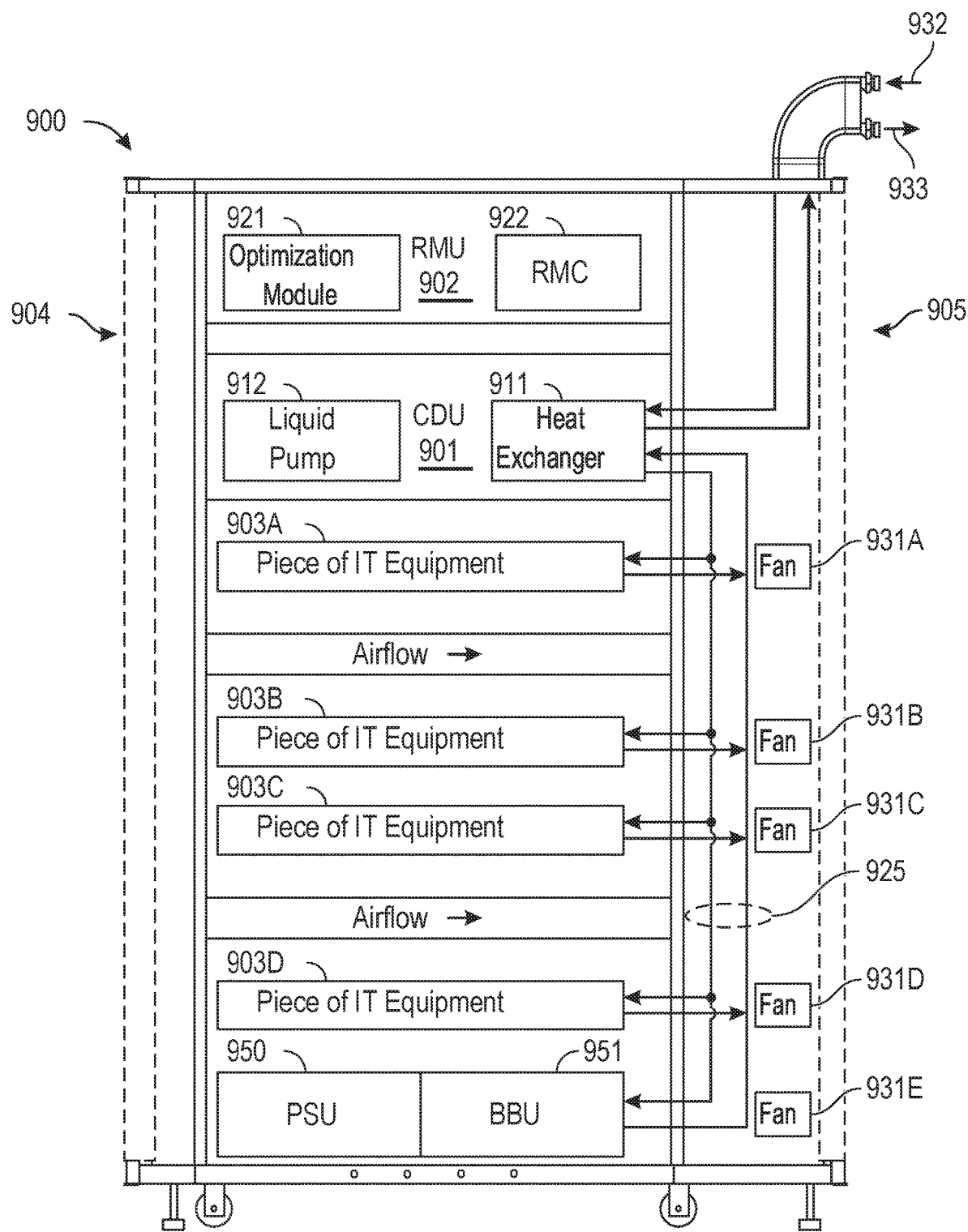
FIG. 7 is a block diagram illustrating an example of an electronic rack according to one embodiment.

FIG. 7 is an example electronic rack that includes a battery backup unit with a fan control unit to control fan speed of the battery backup unit. In one embodiment, electronic rack 900 includes rack manifold and/or CDU 901, RMU 902, and one or more server blades 903A-903E (collectively referred to as server blades 903). Server blades 903 can be inserted into an array of standard slots respectively from frontend 904 of electronic rack 900. Note that although there are only five server blades 903A-903E shown in FIG. 7, more or fewer server blades may be maintained within electronic rack 900. Also note that the particular positions of CDU 901, RMU 902, and server blades 903 are shown for the purpose of illustration only; other arrangements or configurations of CDU 901, RMU 902, and server blades 903 may also be implemented. Further, the front door disposed on frontend 904 and the back door disposed on backend 905 are optional. In some situations, there may no door on frontend 904 and/or backend 905.

In one embodiment, rack manifold and/or CDU (manifold/CDU) 901 may be a rack manifold or an integrated unit having a rack manifold and a rack CDU integrated therein. Rack manifold/CDU 901 may be configured to have the identical or similar form factor of server shelves 903. Typically, a CDU includes heat an exchanger 911, a liquid pump 912, and a pump controller (not shown). The heat exchanger 911 may be a liquid-to-liquid heat exchanger. The primary loop of the CDU is coupled to an external cooling unit (e.g., room CDU) and/or a facility loop of a data center via supply line 932 and return line 933, such as the cooling unit as described above. The secondary loop of the rack CDU is coupled to the upstream ports of the rack manifold unit, where one or more downstream ports of the rack manifold are coupled to at least some of the server shelves 903, represented by liquid distribution loop 925.

With the flexible liquid cooling configuration using manifold/CDU unit 901, any of the server shelves 903 can hook up with manifold/CDU unit 901 to receive liquid cooling, as long as the cold plates are implemented in the server shelves. In this example, servers 903B-903C and 903E are liquid cooled by connecting with manifold/CDU 901, while server 903A and 903D are air cooled. There is no fixed or dedicated rack manifold implemented in the rack. With the rack manifold/CDU unit 901, a traditional air cooled electronic rack can be easily converted into a liquid cooled rack.

Each of server blades 903 may include one or more IT components (e.g., CPUs, GPUs, memory, and/or storage devices). Each IT component may perform data processing tasks, where the IT component may include software installed in a storage device, loaded into the memory, and executed by one or more processors to perform the data processing tasks. Server blades 903 may include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which may generate heat during the operations.

Electronic rack 900 further includes RMU 902 configured to provide and manage power supplied to server blades 903 and manifold/CDU 901. RMU 902 may be coupled to a power supply unit (not shown) to manage the power consumption of the power supply unit, as well as other thermal management of the power supply unit (e.g., cooling fans 931A-931D). The power supply unit may include the necessary circuitry (e.g., an alternating current (AC) to direct current (DC) or DC to DC power converter, battery, transformer, or regulator, etc.) to provide power to the rest of the components of electronic rack 900.

In one embodiment, electronic rack 900 further includes a power supply unit (PSU) 950 to provide power to servers of electronic rack 900 and backup battery unit (BBU) 951 to provide backup power when PSU 950 is unavailable. BBU 951 may include a battery management unit for monitoring and controlling discharge of one or more batteries of the BBU 951. BBU 951 may also include or be coupled with a fan unit (e.g., 110 of FIG. 1) for thermal management of the battery of the BBU 951. For example, the battery management unit may provide the fan unit with monitoring data from operation of the battery. The fan unit may include control logic to identify a minimum fan speed to be used to cool the battery or batteries, as described above with respect to FIGS. 1-6.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method of controlling a fan speed for a battery unit, the method comprising:
   determining power discharge and a current temperature of the battery unit;
   obtaining a relationship between a fan speed of a fan for the battery unit and a temperature of the battery unit based on the power discharge and the current temperature of the battery unit;
   determining a remaining time of discharge for the battery unit, and wherein obtaining the relationship between the fan speed for the battery unit and the temperature of the battery unit is further based on the remaining time of discharge;
   identifying, by a processing device, a minimum fan speed based on the relationship between the fan speed and the temperature and a maximum operating temperature of the battery unit to ensure the temperature of the battery unit does not exceed a maximum allowed temperature of the battery unit; and
   controlling the fan by setting the fan speed of the fan to the minimum fan speed.

2. The method of claim 1, further comprising:
   calculating an amount of energy remaining in the battery unit, and wherein obtaining the relationship between the fan speed for the battery unit and the temperature of the battery unit is further based on the amount of energy remaining in the battery unit.

3. The method of claim 2, wherein obtaining the relationship between the fan speed and the temperature of the battery unit comprises:
   obtaining a graph corresponding to the energy remaining in the battery unit, power discharge of the battery unit, and the current temperature of the battery unit, wherein the graph indicates an increase in temperature of the battery unit for a range of fan speeds after full discharge of the energy remaining in the battery unit.

4. The method of claim 1, further comprising:
   determining whether the current temperature is within a threshold range from the maximum allowed temperature of the battery unit;
   in response to determining that the current temperature is within the threshold range, identifying a guaranteed fan speed based on a maximum power discharge of the battery unit; and
   controlling the fan by setting the fan speed to the guaranteed fan speed.

5. The method of claim 1, wherein the battery unit is a battery backup unit of an electronic rack of a data center.

6. The method of claim 1, wherein the power discharge and the current temperature are determined periodically to update the minimum fan speed.

7. An apparatus for controlling a fan speed for a battery unit, comprising:
   a processor,
   a memory coupled to the processor to store instructions, which when executed by the processor, cause the processor to perform operations, the operations comprising:
   determining power discharge and a current temperature of the battery unit;
   obtaining a relationship between a fan speed of a fan for the battery unit and a temperature of the battery unit based on the power discharge and the current temperature of the battery unit;
   determining a remaining time of discharge for the battery unit, and wherein obtaining the relationship between the fan speed for the battery unit and the temperature of the battery unit is further based on the remaining time of discharge;
   identifying, by a processing device, a minimum fan speed based on the relationship between the fan speed and the temperature and a maximum operating temperature of the battery unit to ensure the temperature of the battery unit does not exceed a maximum allowed temperature of the battery unit; and
   controlling the fan by setting the fan speed of the fan to the minimum fan speed.

8. The apparatus of claim 7, wherein the operations further comprise:
   calculating an amount of energy remaining in the battery unit, and wherein obtaining the relationship between the fan speed for the battery unit and the temperature of the battery unit is further based on the amount of energy remaining in the battery unit.

9. The apparatus of claim 8, wherein obtaining the relationship between the fan speed and the temperature of the battery unit comprises:
   obtaining a graph corresponding to the energy remaining in the battery unit, power discharge of the battery unit, and the current temperature of the battery unit, wherein the graph indicates an increase in temperature of the battery unit for a range of fan speeds after full discharge of the energy remaining in the battery unit.

10. The apparatus of claim 7, wherein the operations further comprise:
    determining whether the current temperature is within a threshold range from the maximum allowed temperature of the battery unit;
    in response to determining that the current temperature is within the threshold range, identifying a guaranteed fan speed based on a maximum power discharge of the battery unit; and
    controlling the fan by setting the fan speed to the guaranteed fan speed.

11. The apparatus of claim 7, wherein the battery unit is a battery backup unit of an electronic rack of a data center.

12. The apparatus of claim 7, wherein the power discharge and the current temperature are determined periodically to update the minimum fan speed.

13. A non-transitory machine-readable storage medium having instructions stored therein, which when executed by a processor, cause the processor to perform operations, the operations comprising:

a processor, a memory coupled to the processor to store instructions, which when executed by the processor, cause the processor to perform operations, the operations comprising:

determining power discharge and a current temperature of a battery unit;

obtaining a relationship between a fan speed of a fan for the battery unit and a temperature of the battery unit based on the power discharge and the current temperature of the battery unit;

determining a remaining time of discharge for the battery unit, and wherein obtaining the relationship between the fan speed for the battery unit and the temperature of the battery unit is further based on the remaining time of discharge;

identifying, by a processing device, a minimum fan speed based on the relationship between the fan speed and the temperature and a maximum operating temperature of the battery unit to ensure the temperature of the battery unit does not exceed a maximum allowed temperature of the battery unit; and controlling the fan by setting the fan speed of the fan to the minimum fan speed.

14. The non-transitory machine-readable storage medium of claim 13, wherein the operations further comprise:

calculating an amount of energy remaining in the battery unit, and wherein obtaining the relationship between the fan speed for the battery unit and the temperature of the battery unit is further based on the amount of energy remaining in the battery unit non-transitory machine-readable storage medium.

15. The non-transitory machine-readable storage medium of claim 14, wherein obtaining the relationship between the fan speed and the temperature of the battery unit comprises:

obtaining a graph corresponding to the energy remaining in the battery unit, power discharge of the battery unit, and the current temperature of the battery unit, wherein the graph indicates an increase in temperature of the battery unit for a range of fan speeds after full discharge of the energy remaining in the battery unit.

16. The non-transitory machine-readable storage medium of claim 13, wherein the operations further comprise:

determining whether the current temperature is within a threshold range from the maximum allowed temperature of the battery unit;

in response to determining that the current temperature is within the threshold range, identifying a guaranteed fan speed based on a maximum power discharge of the battery unit; and controlling the fan by setting the fan speed to the guaranteed fan speed.

17. The non-transitory machine-readable storage medium of claim 13, wherein the battery unit is a battery backup unit of an electronic rack of a data center.

18. The non-transitory machine-readable storage medium of claim 13, wherein the power discharge and the current temperature are determined periodically to update the minimum fan speed.

* * * * *